United States Patent
Tajima et al.

(10) Patent No.: US 7,800,464 B2
(45) Date of Patent: Sep. 21, 2010

(54) SURFACE ACOUSTIC WAVE DEVICE AND DUPLEXER

(75) Inventors: Motoyuki Tajima, Yokohama (JP);
Toshio Nishizawa, Yokohama (JP);
Osamu Ikata, Yokohama (JP)

(73) Assignee: Fujitsu Media Devices Limited, Yokohama (JP)

( * ) Notice: Subject to any disclaimer, the term of this patent is extended or adjusted under 35 U.S.C. 154(b) by 90 days.

(21) Appl. No.: 12/103,814

(22) Filed: Apr. 16, 2008

(65) Prior Publication Data
US 2008/0252394 A1 Oct. 16, 2008

(30) Foreign Application Priority Data
Apr. 16, 2007 (JP) ............... 2007-107329

(51) Int. Cl.
*H03H 9/15* (2006.01)
*H01L 41/083* (2006.01)

(52) U.S. Cl. ............... 333/193; 333/133; 310/313 R

(58) Field of Classification Search ............... 333/133, 333/193, 194, 195, 196; 310/313 R
See application file for complete search history.

(56) References Cited

U.S. PATENT DOCUMENTS

| | | | | |
|---|---|---|---|---|
| 5,446,330 | A * | 8/1995 | Eda et al. ............... | 310/313 R |
| 6,037,847 | A | 3/2000 | Ueda et al. | |
| 6,946,772 | B2 * | 9/2005 | Inoue et al. ............... | 310/313 R |
| 7,208,859 | B2 * | 4/2007 | Miura et al. ............... | 310/313 R |
| 7,298,230 | B2 * | 11/2007 | Inoue ............... | 333/133 |
| 7,331,092 | B2 * | 2/2008 | Miura et al. ............... | 29/25.35 |
| 2004/0135650 | A1 | 7/2004 | Miura et al. | |
| 2004/0222717 | A1 * | 11/2004 | Matsuda et al. ............... | 310/313 R |
| 2004/0226162 | A1 * | 11/2004 | Miura et al. ............... | 29/594 |
| 2005/0194864 | A1 | 9/2005 | Miura et al. | |
| 2006/0091977 | A1 | 5/2006 | Inoue et al. | |
| 2007/0120623 | A1 * | 5/2007 | Sakiyama et al. ............... | 333/133 |
| 2009/0256444 | A1 * | 10/2009 | Suzuki et al. ............... | 310/313 B |

FOREIGN PATENT DOCUMENTS

| | | | |
|---|---|---|---|
| CN | 1159100 A | | 9/1997 |
| CN | 1770628 A | | 5/2006 |
| JP | 06-164306 A | | 6/1994 |
| JP | 2004-186868 A | | 7/2004 |
| JP | 2004-343359 A | | 12/2004 |
| JP | 2005-252550 A | | 9/2005 |
| JP | 2006-319679 A | | 11/2006 |
| JP | 2007028538 A | * | 2/2007 |

* cited by examiner

*Primary Examiner*—Dean O Takaoka
(74) *Attorney, Agent, or Firm*—Arent Fox LLP

(57) ABSTRACT

A surface acoustic wave device includes a supporting substrate, a LiTaO3 piezoelectric substrate joined on the supporting substrate, which has a normal line direction on a main surface thereof in a direction rotated 43° to 53° from a Y axis to a Z axis direction about an X axis, and an electrode pattern formed on the piezoelectric substrate.

6 Claims, 11 Drawing Sheets

SURFACE ACOUSTIC WAVE DEVICE AND DUPLEXER

BACKGROUND OF THE INVENTION

1. Field of the Invention

The present invention generally relates to a surface acoustic wave device and a duplexer, and more particularly, to a surface acoustic wave device and a duplexer in which a piezoelectric substrate is joined on a supporting substrate.

2. Description of the Related Art

Recently, cellular phones, personal digital accesses and the like have been spread rapidly according to the progress of the mobile communication system. For example, a high-frequency band such as a frequency band from 800 MHz to 1.0 GHz and from 1.5 GHz to 2.0 GHz is used for cellular phones. A surface acoustic wave device such as a surface acoustic wave filter and a duplexer are used in this area.

A piezoelectric substrate used for surface acoustic wave devices such as a $LiTaO_3$ (lithium tantalate) $LiNbO_3$ (lithium niobate) substrate has an advantage that a large electromechanical coupling coefficient is available, and a disadvantage that the resonance (or anti-resonance) frequency thereof depends on temperature greatly. In contrast, crystal has a resonance (or anti-resonance) frequency that does not depend on temperature greatly, while having a small electromechanical coupling coefficient.

Japanese Patent Application Publication Nos. 2004-186868, 2005-252550 and 2004-343359 (hereinafter referred to as Documents 1, 2 and 3, respectively) disclose a surface acoustic wave device in which a $LiTaO_3$ piezoelectric substrate is joined on a sapphire substrate and an electrode pattern such as IDT (InterDigital Transducer) is provided on the piezoelectric substrate.

In Documents 1 and 2, the $LiTaO_3$ piezoelectric substrate (an LT substrate) has a normal line direction on the surface thereof in a direction that is rotated 42° from a Y axis to a Z axis direction about an X axis in which a surface acoustic wave is propagated (this is called a 42° cut substrate). The 42° cut substrate is mainly used for the surface acoustic wave device including the LT substrate, since the propagation loss thereof is small. However, in the surface acoustic wave device described in Documents 1 through 3, ripples are generated in a resonance characteristic of resonator or a pass band of filter.

SUMMARY OF THE INVENTION

The present invention has been made in view of the above-mentioned circumstances and provides a surface acoustic wave device joining a $LiTaO_3$ piezoelectric substrate on a supporting substrate, in which a ripple is restrained.

According to an aspect of the present invention, there is provided a surface acoustic wave device including: a supporting substrate; a LiTaO3 piezoelectric substrate joined on the supporting substrate, which has a normal line direction on a main surface thereof in a direction rotated 43° to 53° from a Y axis to a Z axis direction about an X axis; and an electrode pattern formed on the piezoelectric substrate.

According to another aspect of the present invention, there is provided a duplexer including: a common terminal; and a first filter and a second filter connected to the common terminal, wherein at least one of the first and second filters is configured as mentioned above.

DESCRIPTION OF THE PREFERRED EMBODIMENTS

A description will now be given of embodiments of the present invention with reference to the accompanying drawings.

First Embodiment

Figure 1:
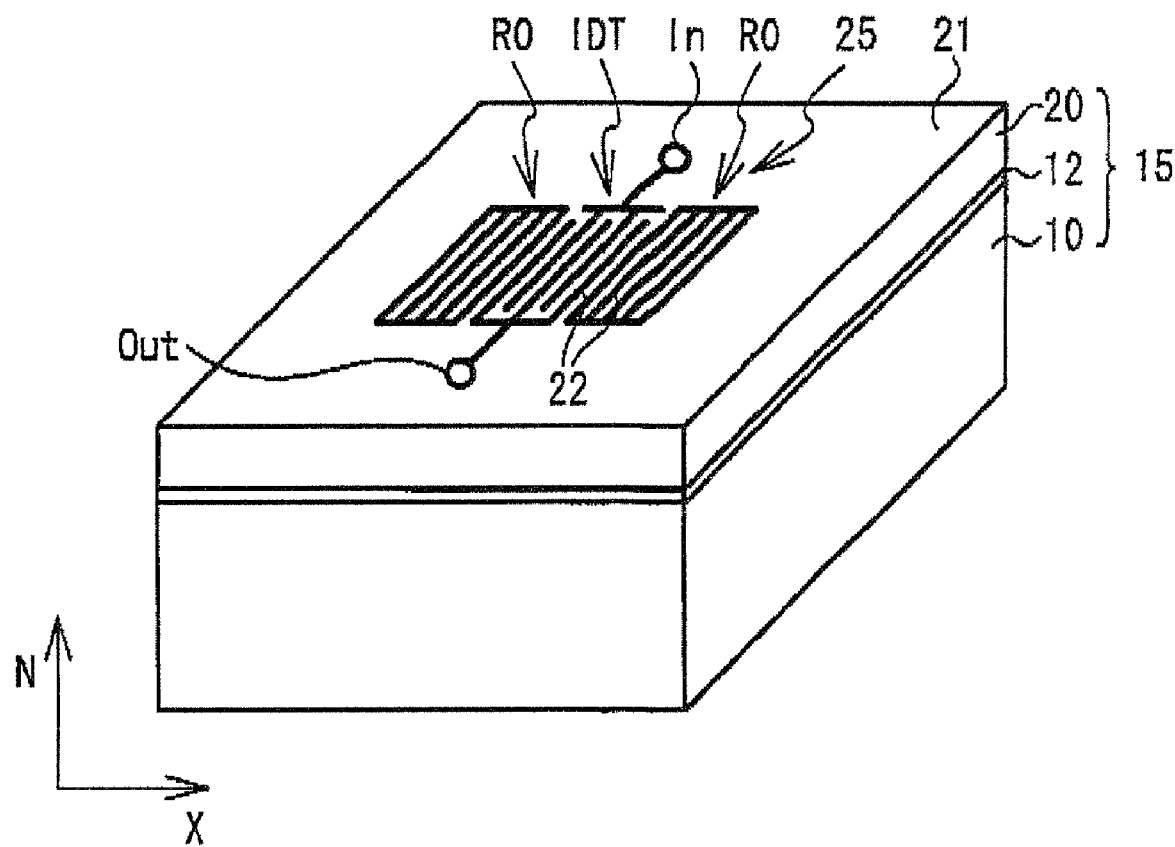
FIG. 1 is a perspective view of a resonator in accordance with a first comparative example and a first embodiment.

FIG. 1 is a perspective view of a surface acoustic wave resonator formed by joining a LiTaO3 piezoelectric substrate (hereinafter an LT substrate) 20 on a sapphire substrate 10 (a supporting substrate). The LT substrate 20 having a film thickness of 40 μm is joined on the sapphire substrate 10 having a film thickness of 250 μm so as to form an LT/sapphire substrate 15. The same method of forming the LT/sapphire substrate 15 as described in Documents 2 and 3 is employed to the present embodiment. As mentioned in Document 2, an amorphous joining region 12 having a thickness of 0.3~2.5 nm is provided at a joined interface between the sapphire substrate 10 and the LT substrate 20. The interface between the sapphire substrate 10 and the LT substrate 20 is substantially smooth, although having a slight roughness caused by forming the amorphous joining region 12.

An electrode IDT and reflectors RO as an electrode pattern 22 made of Al (aluminum) are provided on the LT substrate 20. A propagating direction of the surface acoustic wave is in the X axis, and the reflectors RO are respectively provided on both sides of the IDT in the direction of the X axis. The IDT has an input terminal In and an output terminal Out so as to function as a resonator 25. The wavelength of the surface acoustic wave is approximately 4 μm. The normal line direction of a main surface 21 of the LT substrate 20 is an N direction. According to examples of Document 1 through Document 3, the N direction is the direction that is rotated 42° from the Y axis to the Z axis about the X axis, which is the propagating direction of the surface acoustic wave. In this way, the 42° Y cut LT/sapphire substrate is used in the present surface acoustic wave device.

Figure 2A:
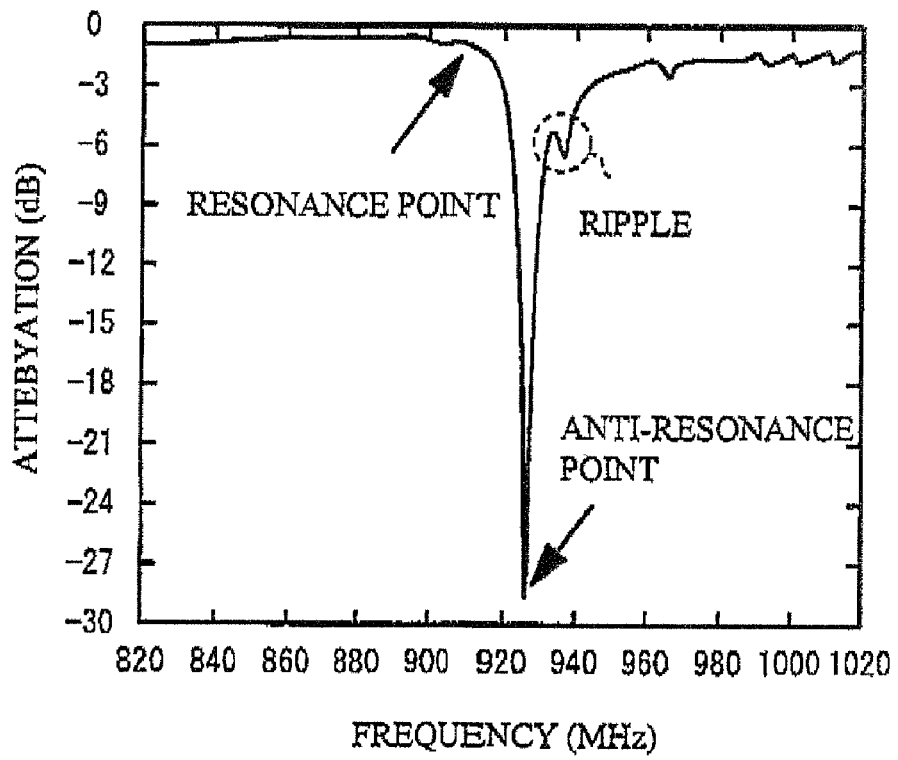
FIGS. 2A and 2B are graphs of a band-pass characteristic when the resonator in accordance with the first comparative example is a series resonator.
Figure 2B:
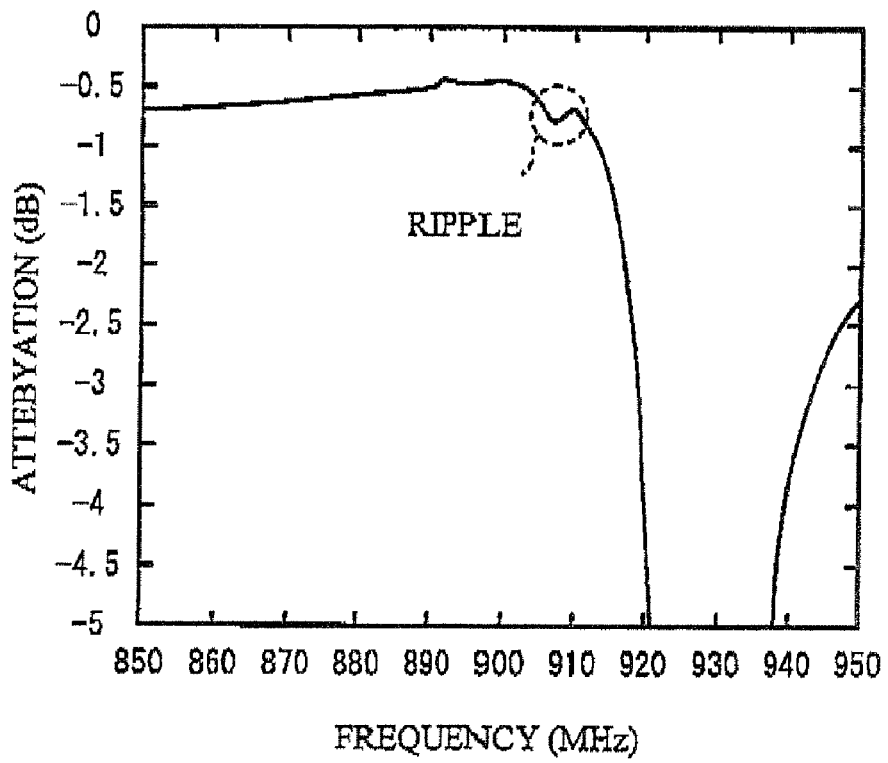

FIG. 2A is a graph of a band-pass characteristic in which the resonator 25 using the 42° Y cut LT/sapphire substrate of a first comparative example is used as a series resonator, and FIG. 2B is an enlarged graph of an area including the resonance point. Referring to FIG. 2A, a ripple is observed at a frequency of about 935 MHz, which is a little higher than an anti-resonance point, Referring to FIG. 2B, another ripple is observed at a frequency of about 905 MHz, which is a little lower than the resonance point.

Figure 3A:
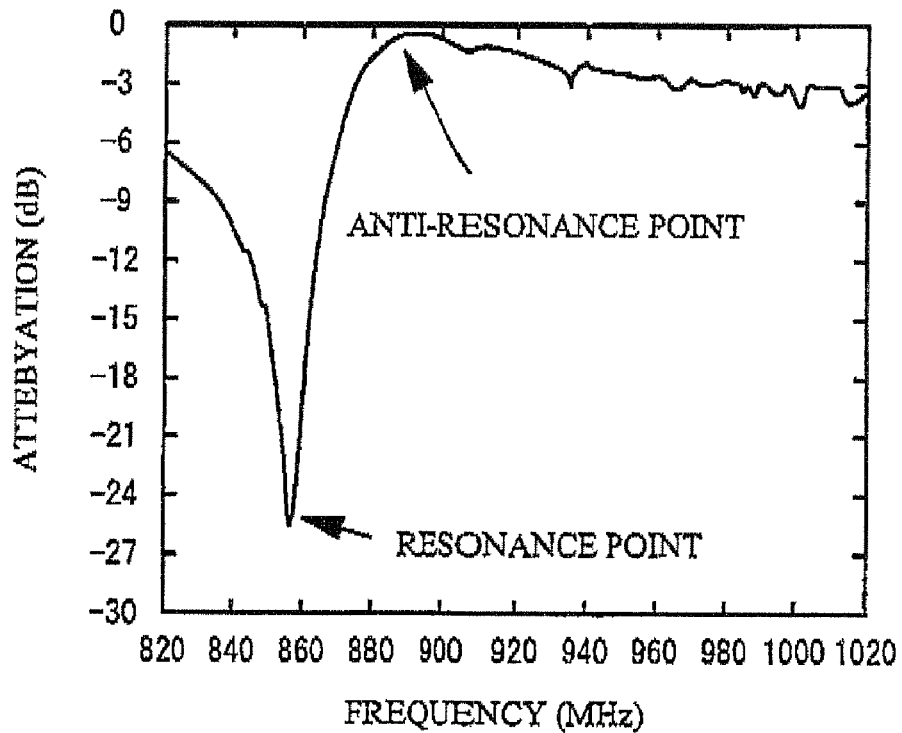
FIGS. 3A and 3B are graphs of a band-pass characteristic when the resonator in accordance with the first comparative example is a parallel resonator.
Figure 3B:
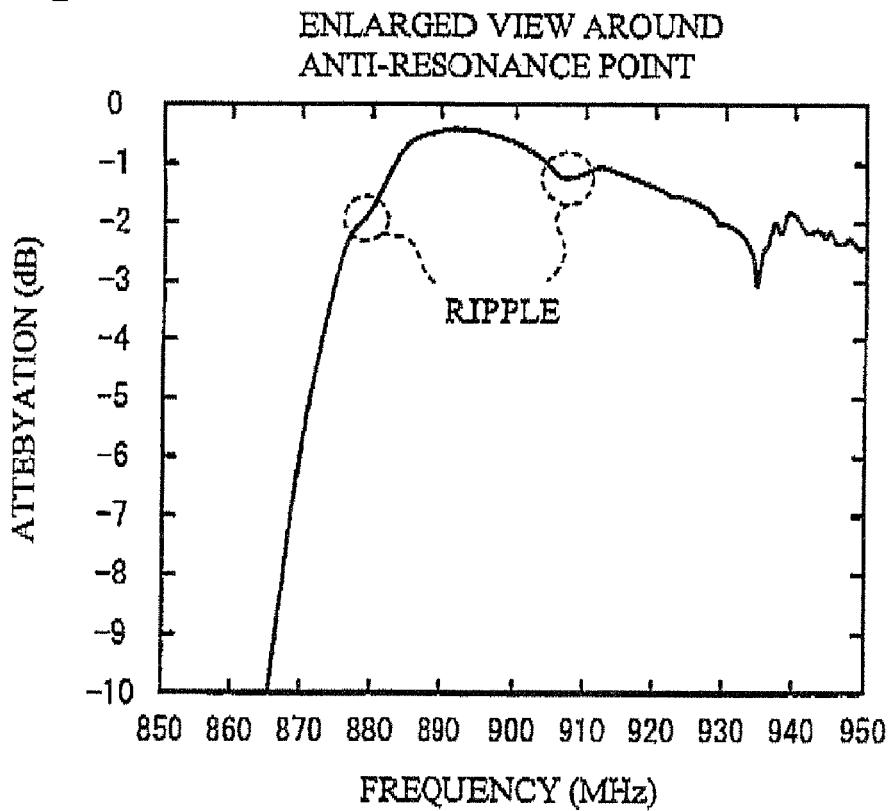

FIG. 3A is a graph of a band-pass characteristic in which the resonator 25 using the 42° Y cut LT/sapphire substrate of the first comparative example is a parallel resonator, and FIG. 3B is an enlarged graph of an area including the anti-resonance point. Referring to FIG. 3B, ripples are observed at a frequency of about 880 MHz, which is a little lower than the anti-resonance point, and at frequency of about 910 MHz, which is a little higher than the anti-resonance frequency.

Figure 4:
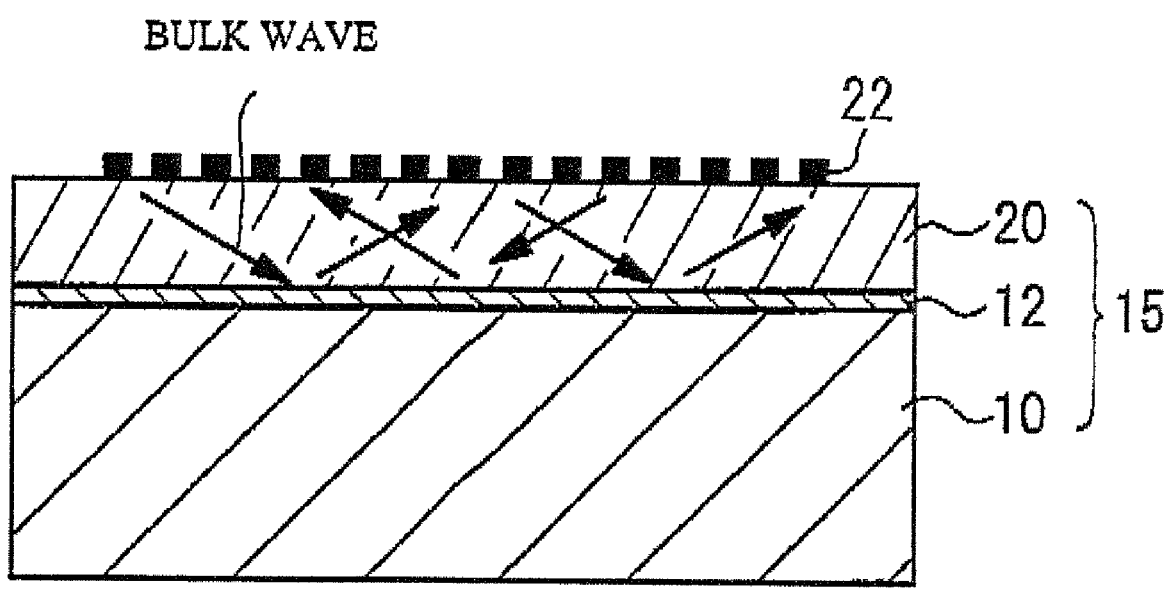
FIG. 4 schematically shows a bulk wave that causes an unwanted response in the first comparative example.

Ripples observed in FIGS. 2A through 3B are caused by bulk waves in the LT substrate 20. FIG. 4 is a cross-sectional view of the resonator 25 shown in FIG. 1. In order to secure a joining strength of the LT substrate 20 and the sapphire substrate 10, the joint interface should be substantially smooth. If the joint interface has a roughness, the coupling strength is degraded. If the joint interface is smooth, however, the bulk waves reflected at the interface between the LT substrate 20 and the sapphire substrate 10 are propagated as shown in FIG. 4 since the LT substrate 20 is as thin as 10λ (λ is the wavelength of the surface acoustic wave). The unwanted responses caused by the bulk waves are observed as ripples in FIGS. 2A through 3B.

Figure 5:
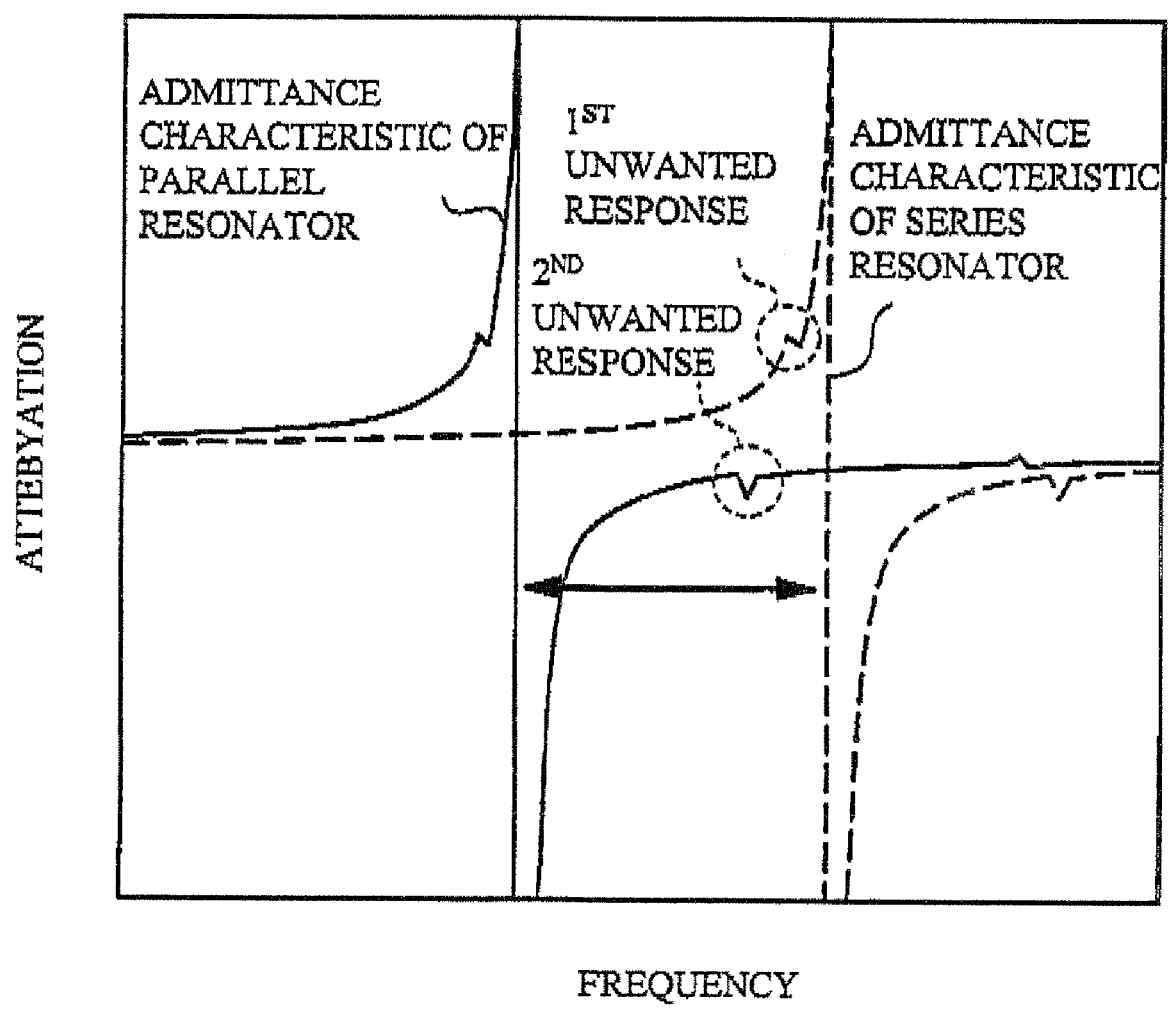
FIG. 5 schematically shows admittance characteristics of the series and parallel resonators in the first comparative example.

FIG. 5 schematically shows admittance characteristics of the series and parallel resonators that compose a ladder filter, according to the band-pass characteristics of the resonator 25 of the first comparative example shown in FIGS. 2A through 3B. A first unwanted response and a second unwanted response are generated in a pass-band of the filter. If the interface between the LT substrate 20 and the sapphire substrate 10 is uneven, the bulk waves reflected at the interface are scattered. It is thus possible to restrain the unwanted responses in FIG. 5. On the contrary, it is preferable that the interface has a smoothness in order to restrain bulk waves reflected by the interface from being scattered and to secure the joining strength of the LT substrate 20 and the sapphire substrate 10.

Figure 6:
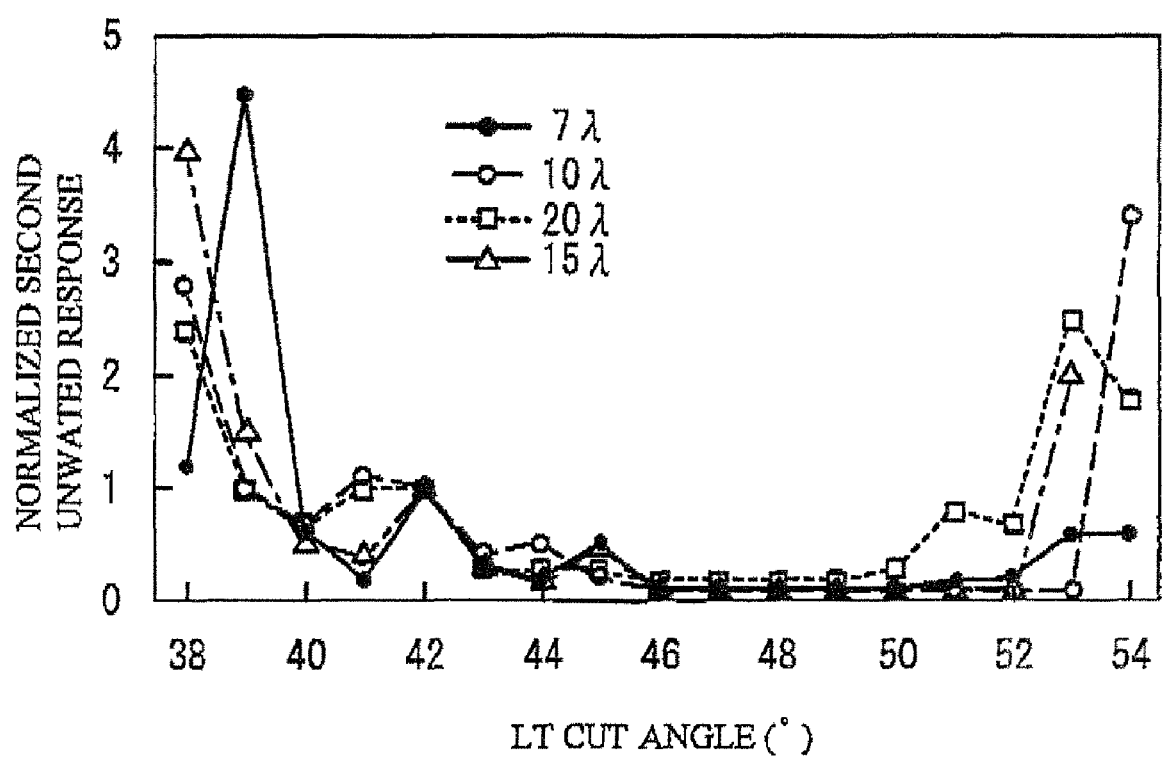
FIG. 6 is a graph of a normalized unwanted response as a function of an LT cut angle.

According to an aspect of the present invention, an LT cut angle is changed to simulate the magnitude of the second unwanted response in FIG. 5, in order to solve the above-mentioned problem. The LT cut angle is the angle in which the normal line direction of the main surface of the LT substrate 20 is rotated from the Y axis to the Z axis about the X axis which is the propagating direction of the surface acoustic wave. FIG. 6 is a graph showing unwanted responses observed at LT cut angles of 38°~54° and normalized by the unwanted response observed at the 42° LT cut angle. The simulation set the thickness of the LT substrate equal to 7λ, 10λ, 15λ and 20λ (λ is the wavelength of the surface acoustic wave). The electrode pattern 22 was made of Al and had a film thickness of 0.1λ.

When the LT cut angle is 43°~52°, the normalized unwanted response is less than or equal to 1 for each film thickness of the LT substrate 20. That is, the unwanted response can be reduced, as compared to the general cases using an LT cut angle of 42. For the LT cut angle in the range of 43°~53°, the normalized unwanted response is less than or equal to 1 when the film thickness of the LT substrate 20 is 7λ or 10λ. Further, for the LT cut angle of 46°~50°, the normalized unwanted response is less than or equal to 0.2 and is substantially constant. As mentioned above, the LT cut angle should be 43°~53°, preferably should be 43°~52°, more preferably should be 46°~50°.

Since the surface acoustic wave mainly is propagated on a surface, the film thickness of the electrode pattern 22 influences the band-pass characteristic of the resonator using the surface acoustic wave. On the other hand, the unwanted response caused by the bulk wave shown in FIG. 4 is not influenced by the film thickness of the electrode pattern 22. The above will be explained below in detail. When the electrode pattern 22 is provided on the surface of the LT substrate 20, the impedance of the resonator is remarkably small. In contrasts when the electrode pattern 22 is not provided on the surface of LT substrate 20, the impedance of the resonator is remarkably large. In the boundary of the electrode pattern 22 having great impedance difference on the surface of the LT substrate 20, the bulk wave is emitted in the LT substrate 20. The bulk wave is then reflected on the boundary between the LT substrate 20 and the sapphire substrate 10. The reflected bulk wave is absorbed into the electrode pattern 22 on the surface of LT substrate 20, and becomes an unwanted response. As described above, the bulk wave is merely propagated in the LT substrate 20, the film thickness of the electrode pattern 22 hardly influences the magnitude of unwanted response.

FIG. 6 shows that the magnitude of unwanted response depends on the film thickness of the LT substrate 20. However, the film thickness of the LT substrate 20 hardly influences the dependence of unwanted response on the LT cut angle. The preferable range of the LT cut angle hardly depends on the film thickness of the LT substrate 20.

Figure 7:
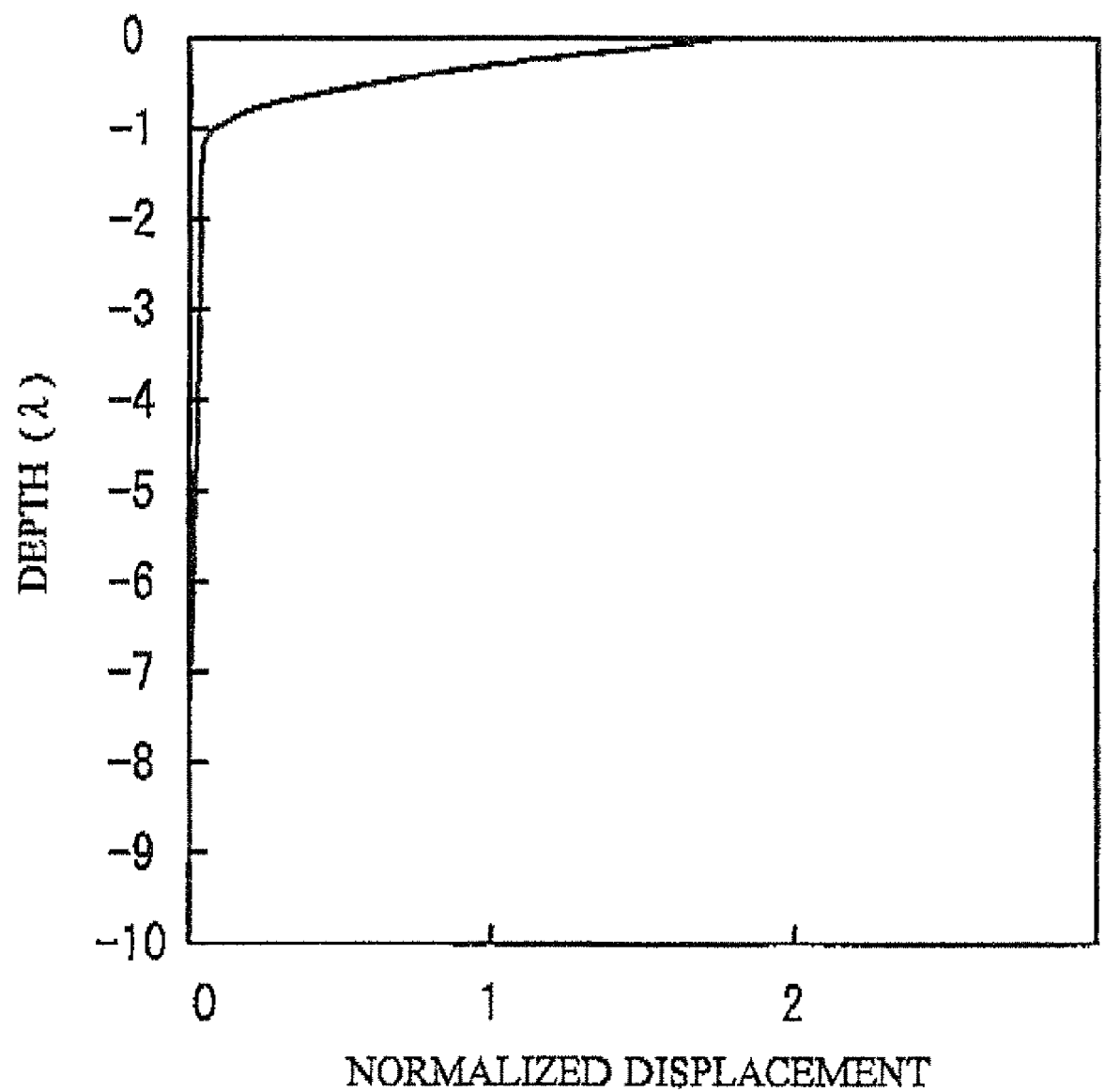
FIG. 7 is a graph of a depth as a function of a normalized displacement.

FIG. 7 is a graph that shows a displacement distribution of a Leaky surface acoustic wave propagated on the surface of the LT substrate 20 in the depth direction. The displacement of the Leaky surface acoustic wave is almost at depths equal to or less than 1λ (λ is the wavelength of the surface acoustic wave). Therefore, the film thickness of the LT substrate 20 is preferably more than or equal to 1λ. Further it is preferable that the LT substrate 20 has a thickness of less than or equal to 100λ, since it is rather meaningless to provide the supporting substrate when the LT substrate 20 has a thickness more than 100λ.

Second Embodiment

A second embodiment is a ladder filter having a pass band at a frequency of 900 MHz.

Figure 8:
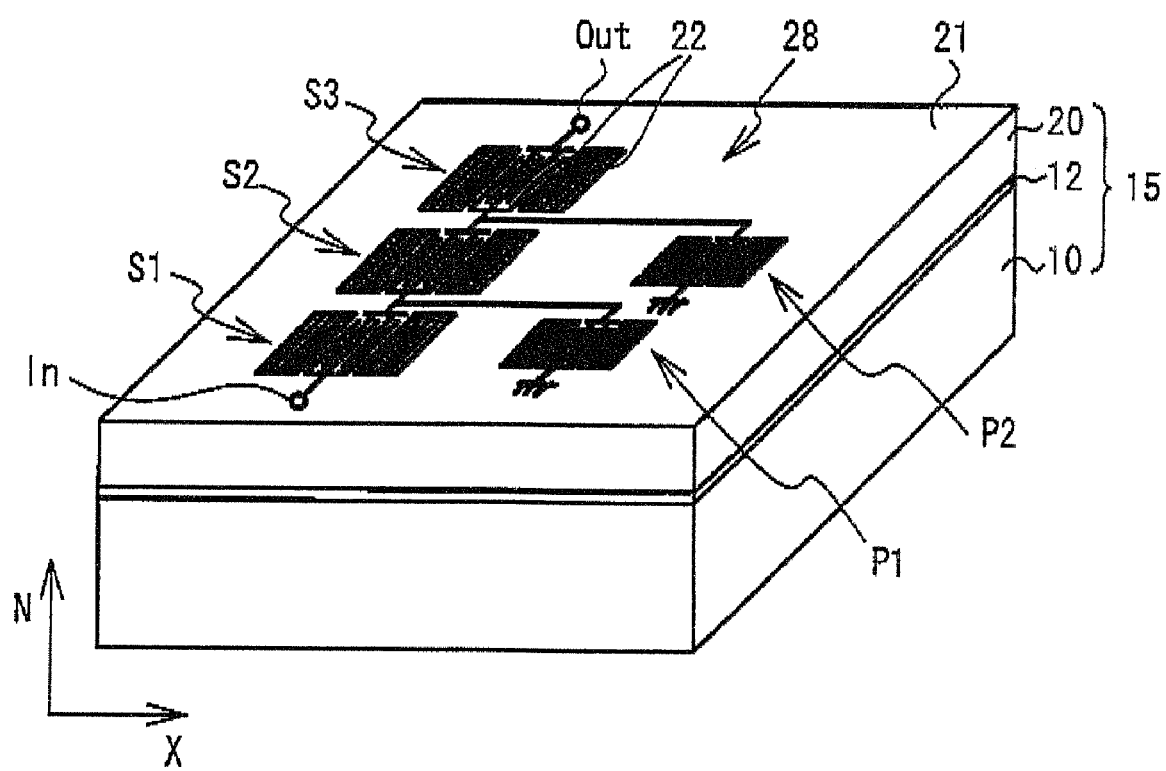
FIG. 8 is a perspective view of a filter in accordance with second and third comparative examples and second and third embodiments.

Referring to FIG. 8, a ladder filter 28 is composed of series resonators S1 through S3 and parallel resonators P1 and P2. On the LT/sapphire substrate 15, the series resonators S1 through S3 are connected in series between an input terminal In and an output to Out. The parallel resonator P1 is connected between a node and ground, the node being between the series resonators S1 and S2. The parallel resonator P2 is connected between another node and the ground, the another node being between the series resonators S2 and S3.

Figure 9A:
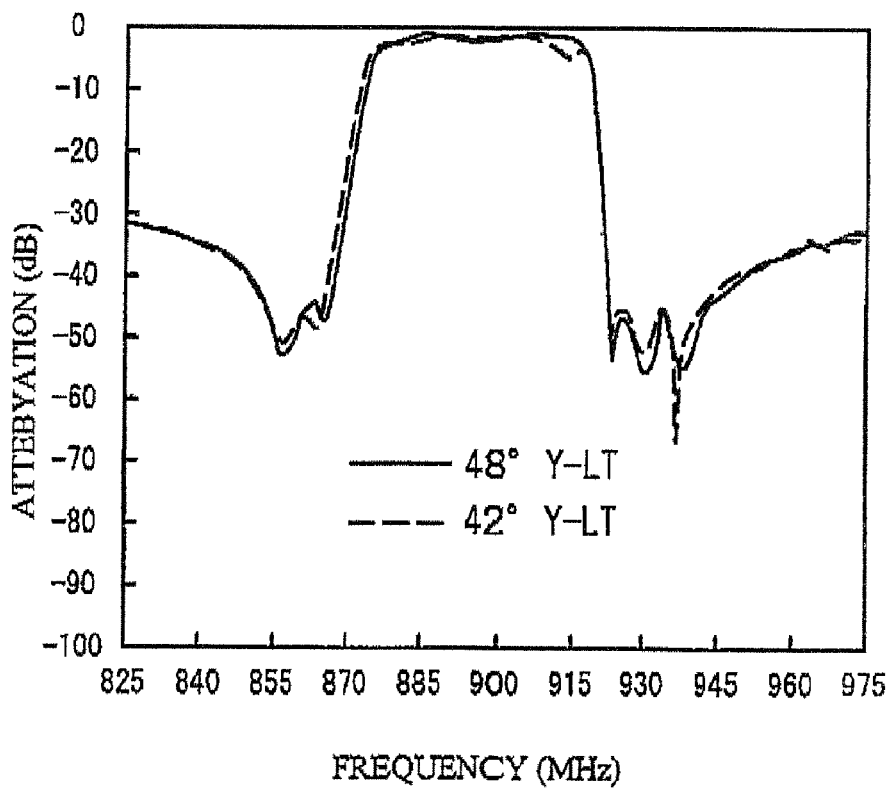
FIGS. 9A and 9B are graphs of band-pass characteristics of the filters in accordance with the second comparative example and the second embodiment.
Figure 9B:
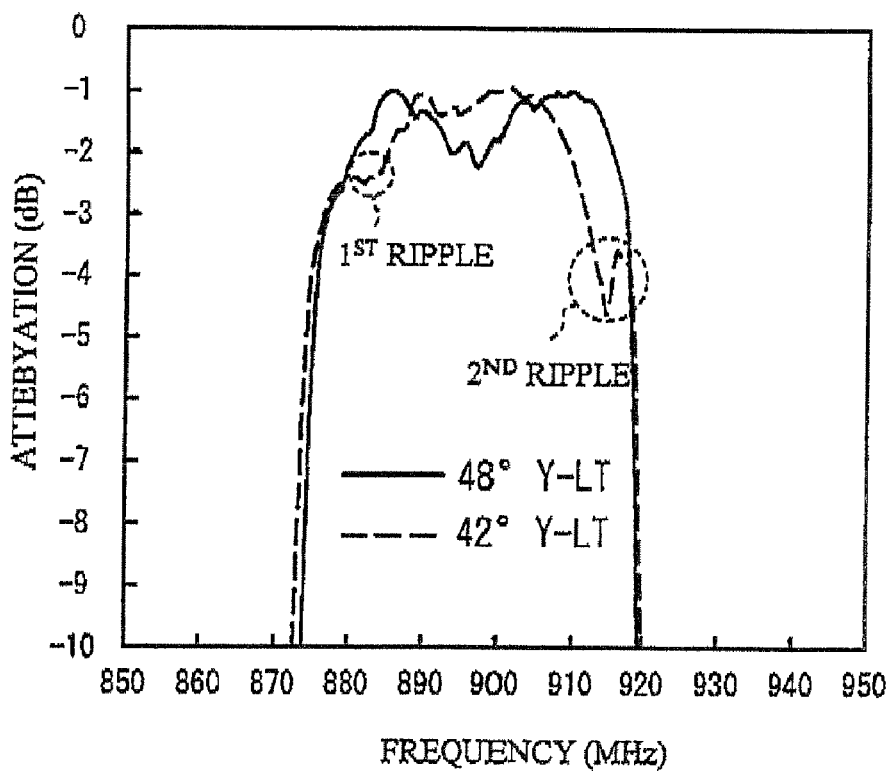

FIG. 9A is a graph of band-pass characteristics, of two ladder filters that have a pass band ranging from 880 MHz to 915 MHz and include the respective LT/sapphire substrates 15 having LT cut angles of 42 degree (a second comparative example) and 48 degree(the second embodiment). FIG. 9l is an enlarged graph of the pass bands of the two ladder filters. Referring to FIG. 9B, the second comparative example has a first ripple and a second ripple respectively observed at frequencies of 883 MS and 915 MHz. The second ripple is remarkably large, and the shoulder on the high frequency side of the pass band comes down. It is considered that the first ripple is influenced by ripples generated on the parallel resonators and the second ripple is influenced by ripples generated on the series and parallel resonators. In contrast the first and second ripples are not observed in the second embodiment. As described above, the unique LT cut angle restrains ripples occurred in the pass band of the ladder filter 28.

Third Embodiment

Figure 10A:
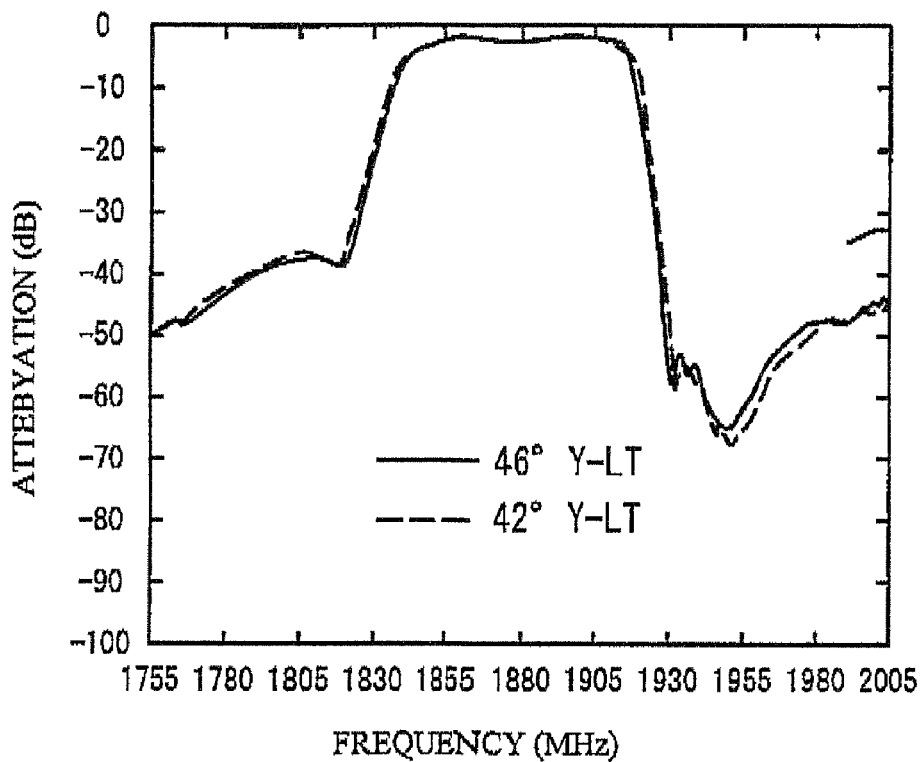
FIGS. 10A and 10B are graphs of band-pass characteristics of the filters in accordance with the third comparative example and the third embodiment.
Figure 10B:
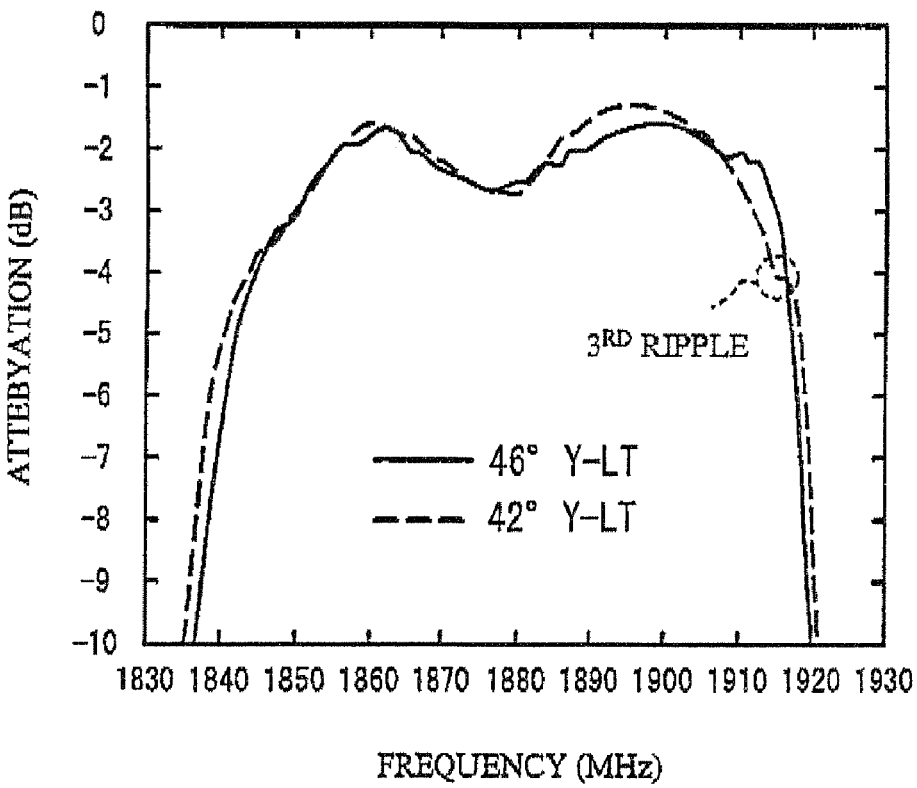

A third embodiment is a ladder filter having a pass band at a frequency of 1900 MHz. FIG. 10A is a graph of band-pass characteristics of two ladder filters that have a pass band at a frequency of around 1900 MHz and include the respective LT/sapphire substrates IS having LT cut angles of 42° (a third comparative example) and 46° (the third embodiment). FIG. 10B is an enlarged graph of the pass bands of the two ladder filters. Referring to FIG. 10B, a third ripple is observed at a frequency of 1915 MHz in the third comparative example. The ripple resulting from the parallel resonator is generated outside of the pass band in the third comparative example. Thus, the third ripple resulting from the series resonator is observed in the pass band. In contrast, the third ripple is restrained in the third embodiment.

According to the second and third embodiments, it is possible to restrain the ripples generated in the pass band of the filter by setting the LT cut angle of the LT substrate 20 equal to 43°~53°. The above is realized by restraining the unwanted responses resulting from the bulk waves in the resonators composing the ladder filter 28 and thus reducing the ripples in the resonance characteristics. The present invention is not limited to the ladder filters in the second and third embodiments, but includes another type of filter such as a multiple mode filter in which the ripples cased by the unwanted responses of the bulk wave can be restrained.

Fourth Embodiment

Figure 11:
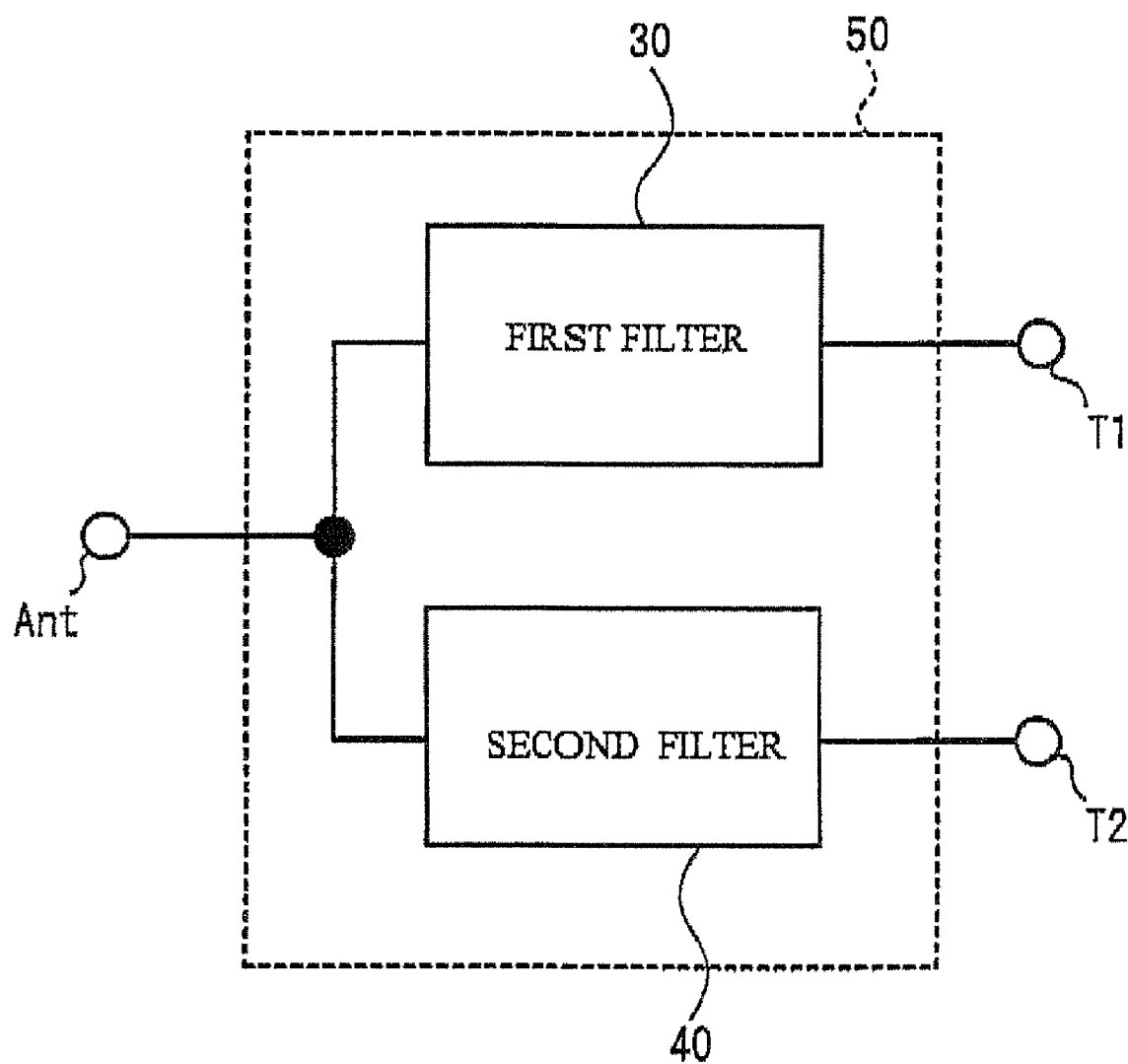
FIG. 11 is a block diagram of a duplexer in accordance with a fourth embodiment.

A fourth embodiment shown in FIG. 11 is an exemplary duplexer using at least one ladder filter 28 of the second or third embodiment. A first filter 30 as a transmission filter is connected between a common terminal Ant and a first terminal T1, and a second filter 40 as a reception filter is connected between the common terminal Ant and a second terminal T2. At least one of the first and second filters 30 and 40 can be the ladder filter 28 of the second or third embodiment. Thus, the ripples can be restrained in the pass band of the duplexer 50.

The first and second filters 30 and 40 are not limited to the ladder filters but may be multiple mode filters. For example, the first filter 30 on the transmission side may be a ladder filter and the second filter 40 on the reception side may be a DMS (double mode SAW) filter. Further, the first and second filters 30 and 40 are made of respective substrates having different LT cut angles.

The supporting substrate that supports the piezoelectric substrate is not limited to the sapphire substrate 10 used in the first through fourth embodiments. The supporting substrate may be made of a material that restrains the frequency-temperature characteristic, that is, a material having a smaller linear expansion coefficient than that of LiTaO$_3$. For example, glass or silicon may be used. The bulk wave shown in FIG. 4 behaves similarly in any material of the supporting substrate, thus the result shown in FIG. 6 can be applied to other supporting substrates. It is preferable, however, to use sapphire as the supporting substrate, since sapphire has a large Young's modulus.

The present invention is not limited to the specifically disclosed embodiments, but other embodiments and variations may be made without departing from the scope of the present invention.

The present application is based on Japanese Patent Application No. 2007-107329 filed Apr. 16, 2007, the entire disclosure of which is hereby incorporated by reference.

What is claimed is:

1. A surface acoustic wave device comprising:
   a supporting substrate;
   a LiTaO3 piezoelectric substrate joined directly on the supporting substrate, which has a normal line direction on a main surface thereof in a direction rotated 43° to 53° from a Y axis to a Z axis direction about an X axis; and
   an electrode pattern formed on the piezoelectric substrate,
   wherein the piezoelectric substrate is attached on the supporting substrate comprising a sapphire substrate,
   wherein the joined interface between the supporting substrate and the piezoelectric substrate has a smoothness that restrains bulk waves reflected by the joined interface from being scattered.

2. The surface acoustic wave device as claimed in claim 1, wherein the normal line direction on the main surface is in the direction rotated 43° to 53° from the Y axis to the Z axis direction about the X axis.

3. The surface acoustic wave device as claimed in claim 1, wherein the normal line direction on the main surface is in the direction rotated 46° to 50° from the Y axis to the Z axis direction about the X axis.

4. The surface acoustic wave device as claimed in claim 1, wherein an amorphous joining region is interposed between the supporting substrate and the piezoelectric substrate.

5. The surface acoustic wave device as claimed in claim 1, wherein the surface acoustic wave device is a filter including a resonator having the electrode pattern.

6. A duplexer comprising:
   a common terminal; and
   a first filter and a second filter connected to the common terminal, at least one of the first and second filters including:
   a supporting substrate;
   a LiTaO3 piezoelectric substrate joined directly on the supporting substrate, which has a normal line direction on a main surface thereof in a direction rotated 43° to 53° from a Y axis to a Z axis direction about an X axis; and
   an electrode pattern formed on the piezoelectric substrate,
   wherein the piezoelectric substrate is attached on the supporting substrate comprising a sapphire substrate,
   wherein the joined interface between the supporting substrate and the piezoelectric substrate has a smoothness that restrains bulk waves reflected by the joined interface from being scattered.

* * * * *